(12) United States Patent
Chen et al.

(10) Patent No.: US 10,892,250 B2
(45) Date of Patent: Jan. 12, 2021

(54) STACKED PACKAGE STRUCTURE WITH ENCAPSULATION AND REDISTRIBUTION LAYER AND FABRICATING METHOD THEREOF

(71) Applicant: Powertech Technology Inc., Hukou Township, Hsinchu County (TW)

(72) Inventors: Ming-Chih Chen, Hukou Township, Hsinchu County (TW); Hung-Hsin Hsu, Hukou Township, Hsinchu County (TW); Yuan-Fu Lan, Hukou Township, Hsinchu County (TW); Hsien-Wen Hsu, Hukou Township, Hsinchu County (TW)

(73) Assignee: Powertech Technology Inc., Hukou Township (TW)

( * ) Notice: Subject to any disclaimer, the term of this patent is extended or adjusted under 35 U.S.C. 154(b) by 0 days.

(21) Appl. No.: 16/229,562

(22) Filed: Dec. 21, 2018

(65) Prior Publication Data
US 2020/0203313 A1 Jun. 25, 2020

(51) Int. Cl.
| | |
|---|---|
| H01L 25/065 | (2006.01) |
| H01L 23/31 | (2006.01) |
| H01L 23/552 | (2006.01) |
| H01L 23/373 | (2006.01) |
| H01L 23/00 | (2006.01) |
| H01L 21/56 | (2006.01) |

(52) U.S. Cl.
CPC ........ *H01L 25/0657* (2013.01); *H01L 21/565* (2013.01); *H01L 23/3157* (2013.01); *H01L 23/3736* (2013.01); *H01L 23/552* (2013.01); *H01L 24/09* (2013.01); *H01L 24/17* (2013.01); *H01L 24/32* (2013.01); *H01L 2224/02371* (2013.01)

(58) Field of Classification Search
CPC ............. H01L 25/0657; H01L 23/3157; H01L 23/552; H01L 23/3736; H01L 24/17; H01L 24/32; H01L 21/565; H01L 24/09; H01L 2224/02371; H01L 23/16; H01L 23/3128; H01L 23/367; H01L 23/49811; H01L 23/5384; H01L 23/31; H01L 23/373; H01L 23/00; H01L 21/56
USPC ........................................................ 257/686
See application file for complete search history.

(56) References Cited

U.S. PATENT DOCUMENTS

| | | | | |
|---|---|---|---|---|
| 2010/0044847 A1* | 2/2010 | Lee | ......... | H01L 23/525 |
| | | | | 257/686 |
| 2012/0228749 A1* | 9/2012 | Pagaila | ................. | H01L 23/147 |
| | | | | 257/659 |
| 2013/0334052 A1* | 12/2013 | Chua | ......... | C25D 5/00 |
| | | | | 205/99 |

(Continued)

*Primary Examiner* — Alexander O Williams
(74) *Attorney, Agent, or Firm* — PatentTM.US

(57) ABSTRACT

A stacked package structure has a metal casing, a stacked chipset, an encapsulation and a redistribution layer. The stacked chipset is adhered in the metal casing. The encapsulation is formed in the metal casing to encapsulate the stacked chip set, but a plurality of surfaces of the metal pads are exposed through the encapsulation. The redistribution layer is further formed on the encapsulation and electrically connects to the metal pads of the stacked chipset. Therefore, the stacked package structure includes the metal casing, so an efficiency of heat dissipation and structural strength are increased.

8 Claims, 9 Drawing Sheets

(56) References Cited

U.S. PATENT DOCUMENTS

| | | | |
|---|---|---|---|
| 2015/0170991 A1* | 6/2015 | Li | H01L 23/3731 |
| | | | 257/777 |
| 2015/0279828 A1* | 10/2015 | Koopmans | H01L 24/81 |
| | | | 257/713 |
| 2015/0333026 A1* | 11/2015 | Gandhi | H01L 24/81 |
| | | | 257/737 |
| 2017/0062383 A1* | 3/2017 | Yee | H01L 24/03 |
| 2017/0213793 A1* | 7/2017 | Hurwitz | H01L 23/36 |
| 2018/0138155 A1* | 5/2018 | Kim | H01L 23/552 |
| 2018/0151510 A1* | 5/2018 | Wu | H01L 21/32051 |
| 2018/0247915 A1* | 8/2018 | Kinsley | H01L 28/20 |
| 2018/0301443 A1* | 10/2018 | Kim | H01L 27/14618 |
| 2019/0273030 A1* | 9/2019 | Lim | H01L 25/105 |
| 2020/0161277 A1* | 5/2020 | Lee | H01L 25/0657 |

\* cited by examiner

STACKED PACKAGE STRUCTURE WITH ENCAPSULATION AND REDISTRIBUTION LAYER AND FABRICATING METHOD THEREOF

BACKGROUND OF THE INVENTION

1. Field of the Invention

The present invention is related to a stacked package structure, and more particularly to a stacked package structure and fabricating method thereof.

2. Description of the Prior Arts

FIG. 5 illustrates a conventional stacked package structure 60 of a high bandwidth memory or a hybrid memory cube. The stacked package structure 60 has an organic substrate 61, a control chip 62, a plurality of memory chips 63 and an encapsulation 64. The control chip 62 is mounted on a lateral portion of the organic substrate 61 and the memory chips 63 are sequentially stacked on the control chip 62. The encapsulation 64 is formed on the lateral portion of the organic substrate 62 and encapsulates the control chip 62 and the memory chips 63 therein.

Since the encapsulation 40 is made of polymer, a heat dissipation of the aforementioned stacked package structure 60 is not good enough and a structural strength thereof is low, too. In addition, no any metal layer covers outer longitudinal portion the encapsulation 40 so the aforementioned stacked package structure 60 has no EMI shielding function.

To overcome the shortcomings of the stacked package structure, the present invention provides a new a stacked package structure to mitigate or obviate the aforementioned problems.

SUMMARY OF THE INVENTION

An objective of the present invention is to provide a stacked package structure and fabricating method thereof.

To achieve the objective as mentioned above, the stacked package structure has a metal casing, a stacked chipset, an encapsulation and a redistribution layer. The stacked chipset is adhered in the metal casing. The encapsulation is formed in the metal casing to encapsulate the stacked chipset. A plurality of surfaces of the metal pads are exposed through the encapsulation. The redistribution layer is further formed on the encapsulation and electrically connects to the metal pads of the stacked chipset.

Based on the foregoing description, the stacked package structure of the present invention includes the metal casing, so an efficiency of heat dissipation and structural strength are increased.

To achieve the objective as mention above, the fabricating method of the stacked package has steps of: (a) providing a metal casing having a lateral portion and a plurality of longitudinal portions extending from an inner surface of the lateral portion; (b) adhering a stacked chipset on an inner surface of the lateral portion, wherein the stacked chipset has an active surface having a plurality of metal pads, and a rear surface opposite to the active surface and adhered to the inner surface of the lateral portion of the metal casing; (c) forming an encapsulation in the metal casing to encapsulate the stacked chipset, wherein a plurality of surfaces of the metal pad are exposed through the encapsulation; and (d) forming a redistribution layer on the encapsulation to electrically connect to the metal pads of the stacked chipset.

Based on the foregoing description, in the fabricating method of the present invention, the metal casing and the stacked chipset are previously prepared. After the stacked chipset is easily adhered in the metal casing, the encapsulation may be easily formed in the metal casing to encapsulate the stacked chipset. The redistribution layer may be formed on the encapsulation and electrically connect to the metal pads of the stacked chipset. Therefore, the metal casing is easily packaged in the stacked package structure.

Other objectives, advantages and novel features of the invention will become more apparent from the following detailed description when taken in conjunction with the accompanying drawings.

DETAILED DESCRIPTION OF THE PREFERRED EMBODIMENTS

The present invention provides a new stacked package structure and a fabricating method thereof. With embodiments and drawings thereof, the features of the present invention are described in detail as follow.

Figure 1A:
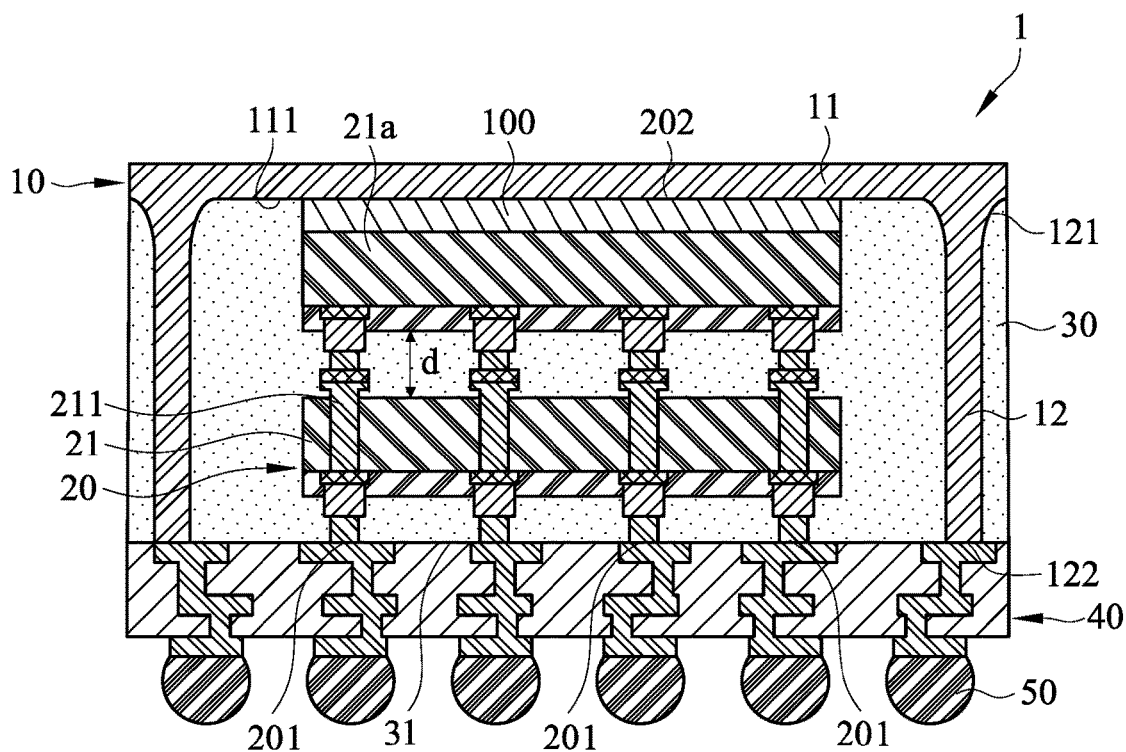
FIG. 1A illustrates a stacked package structure according to a first embodiment of the present invention.

FIG. 1A illustrates a stacked package structure 1 according to a first embodiment of the present invention. The stacked package structure 1 has a metal casing 10, a stacked chipset 20, an encapsulation 30, a redistribution layer 40, and a plurality of outer pads 50.

The metal casing 10 has a lateral portion 11 and a plurality of longitudinal portions 12 extending from an inner surface 111 of the lateral portion 11. In the embodiment, the metal casing 10 is formed by etching a metal block, so a width of one end 121 of each longitudinal portion 12 close to the inner surface 111 of the lateral portion 11 is larger than a width of a free end 122 of each longitudinal portion 12 far away from the inner surface 11 of the lateral portion 11.

Figure 1B:
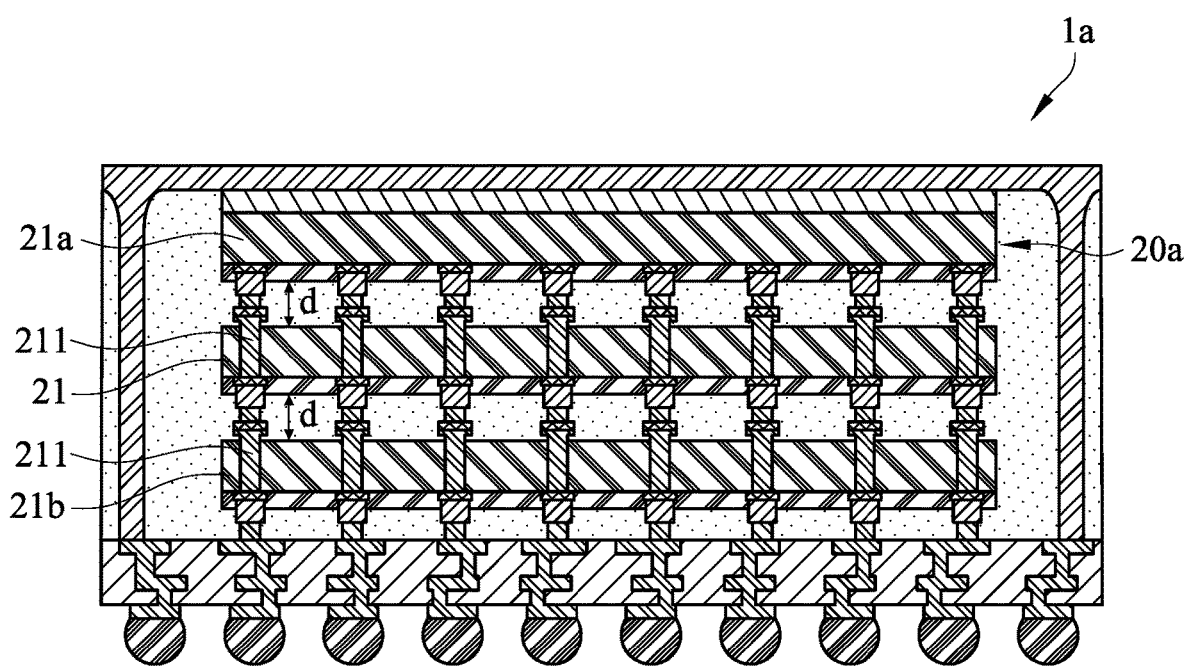
FIG. 1B illustrates a stacked package structure according to a second embodiment of the present invention.

An adhesive layer 100 may be formed on the inner surface 111 of the lateral portion 11. The stacked chipset 20 is adhered in the metal casing 10. The stacked chipset 20 has an active surface having a plurality of metal pads 201, and a rear surface 202 opposite to the active surface. The rear surface 202 is adhered to the adhesive layer 100 on the inner surface 111 of the lateral portion 11. In the embodiment, the stacked chip set 20 has a plurality of chips 21a, 21 stacked on top of each other and at least one gap d defined between the chip 21a and the chip 21. In some embodiment, the chip 21a adhered to the adhesive layer 100 has no through silicon via. The at least one chip 21 stacked on the chip 21a may be one or more chips. In the first embodiment, at least one chip 21 is stacked on the chip 21a and have a plurality of through silicon vias 211 formed in the at least one chip 21. As shown in FIG. 1B, in the second embodiment of a stacked package structure 1a, there are two chips 21, 21b stacked on the chip 21a. The two chips 21, 21b respectively have a plurality of through silicon vias 211. One of the chips 21b disposed further from the chip 21a may be a control chip and the chips 21, 21a may be memory chips.

The encapsulation 30 is formed in the metal casing 10 to encapsulate the stacked chip set 20. In the embodiment, an outer surface 31 of the encapsulation 30, the metal pads 201 of the stacked chipset 20, and the free ends 122 of the longitudinal portions 12 of the metal casing 10 are coplanar. The encapsulation 30 encapsulates the stacked chipset 20. A surface of each metal pad 201 and a surface of each of the free ends 122 are exposed through the encapsulation 30.

The redistribution layer 40 is formed on the outer surface 31 of the encapsulation 30, the surfaces of the metal pads 201 of the stacked chipset 20, and the surfaces of the free ends 122. When at least one of the free ends 122 is electrically connected to the ground of a system power through the redistribution layer 40, the metal casing 10 may be used as an EMI shield. The outer pads 50 are formed on the redistribution layer 40. In the embodiment, the outer pads 50 may be solder balls or the like.

The fabricating method of the stacked package structure 1 as shown in FIG. 1A is further described as follow.

Figure 2A:
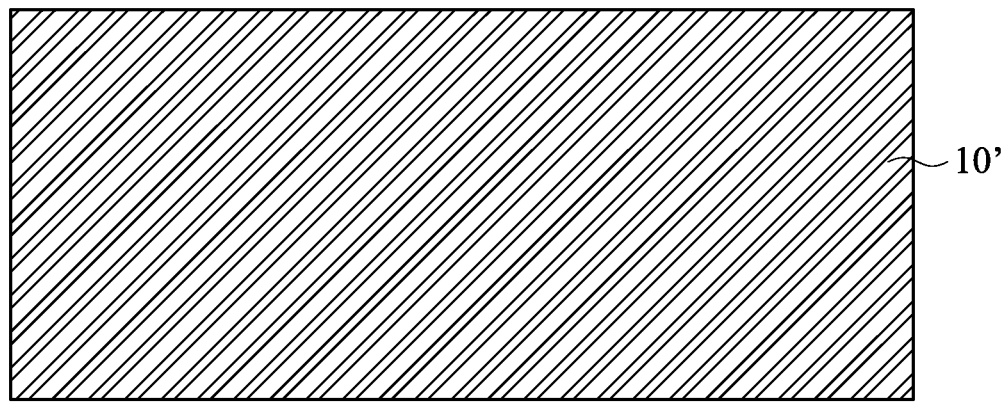
FIGS. 2A to 2F illustrate the stacked package structure of FIG. 1A in the process corresponding to steps of a fabricating method according to a first embodiment of the present invention.
Figure 2B:
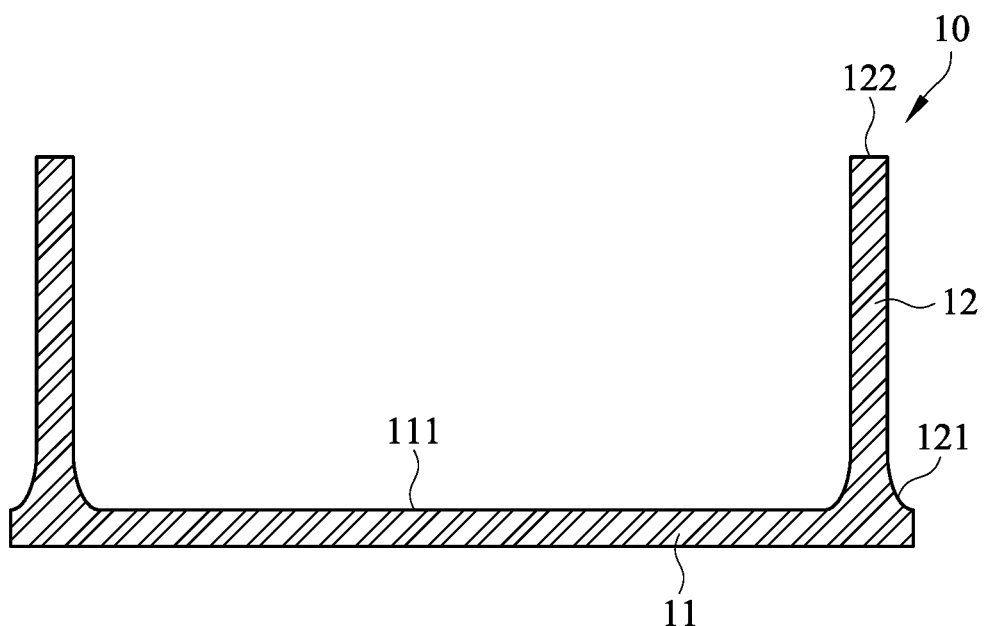

In FIG. 2A, the metal block 10' is provided. In FIG. 2B, the metal block 10' is etched to form a metal casing 10 integrally having a lateral portion 11 and a plurality longitudinal portions 12 extending from an inner surface 111 of the lateral portion 11. In the embodiment, the metal casing 10 may be a quadrilateral shape and, in some embodiment, may have four longitudinal portions 12. The number of longitudinal portions 12 is not limited thereto. In some embodiments, the metal casing 10 may have greater than or less than four longitudinal portions 12.

Figure 2C:
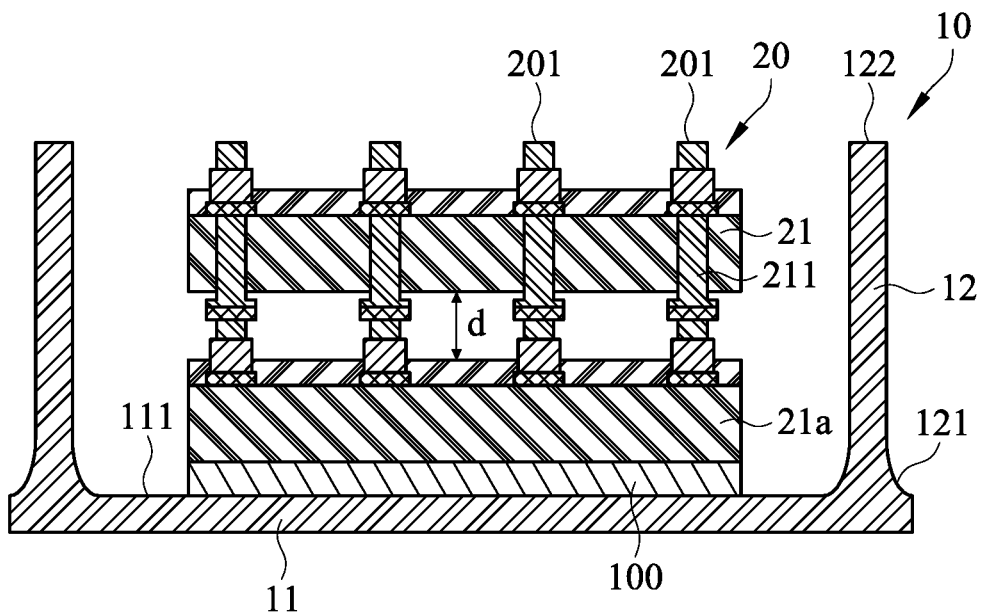

In FIG. 2C, the adhesive layer 100 is disposed on the inner surface 111 of the lateral portion 11 of the metal casing 10. The stacked chipset 20 may be disposed on the adhesive layer 100 and adhered to the inner surface 111 of the lateral portion 11 through the adhesive layer 100. The stacked chipset 20 may have more than one chip. At least one gap d is defined between the adjacent chips 21a, 21.

Figure 2D:
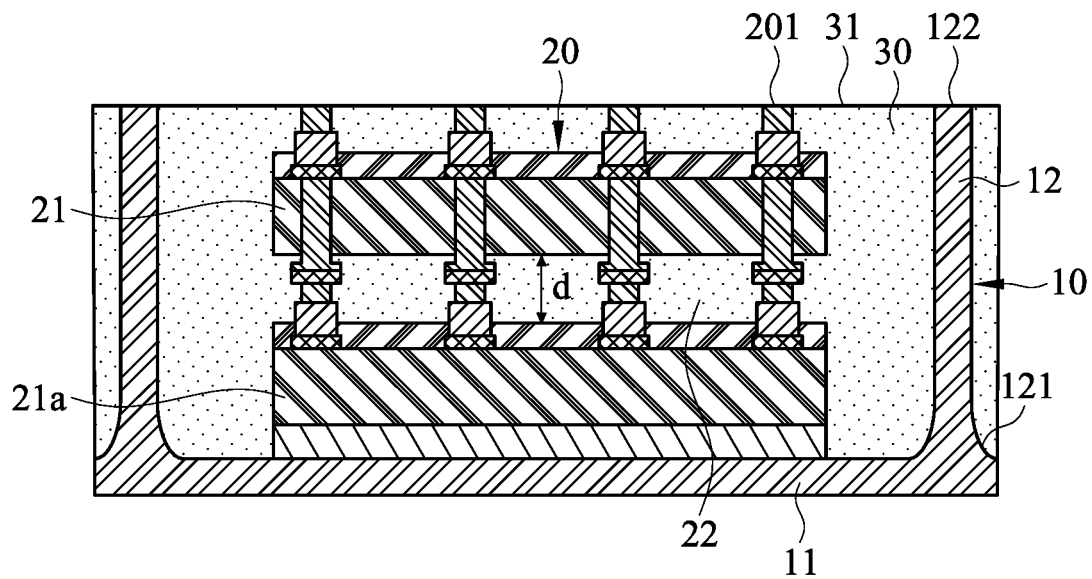

In FIG. 2D, the metal casing 10 is filled with a molding compound to form the encapsulation 30 and encapsulate the stacked chipset 20. The surfaces of the metal pad 201 may be exposed through the encapsulation 30. In some embodiment, the surfaces of the metal pad 201 may be exposed by grinding excess of the encapsulation 30. In the embodiment, the gap d defined between the chips 21a, 21 may also be filled with the molding compound. Therefore, the encapsulation 30 and the compound 22 formed in the gap d are formed at the same time. In the embodiment, the encapsulation 30 may further encapsulates the longitudinal portions 12 and the surfaces of the free ends 122 of the longitudinal portions 12 are exposed through the encapsulation 30. The outer surface 31 of the encapsulation 30, the surfaces of the metal pads 201, and the surfaces of the free ends 122 may be coplanar to each other.

Figure 2E:
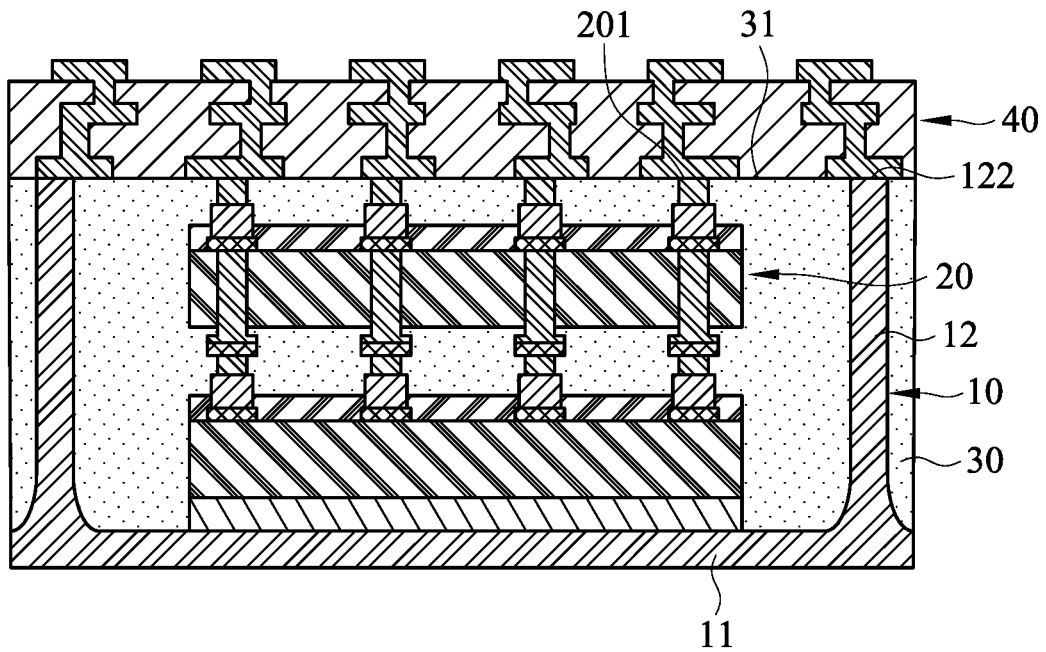

In FIG. 2E, the redistribution layer 40 is formed on the outer surface 31 of the encapsulation 30 and electrically connects to the metal pads 201 of the stacked chipset 20. The redistribution layer 40 may further be electrically connected to the free ends 122 of the longitudinal portions 12.

Figure 2F:
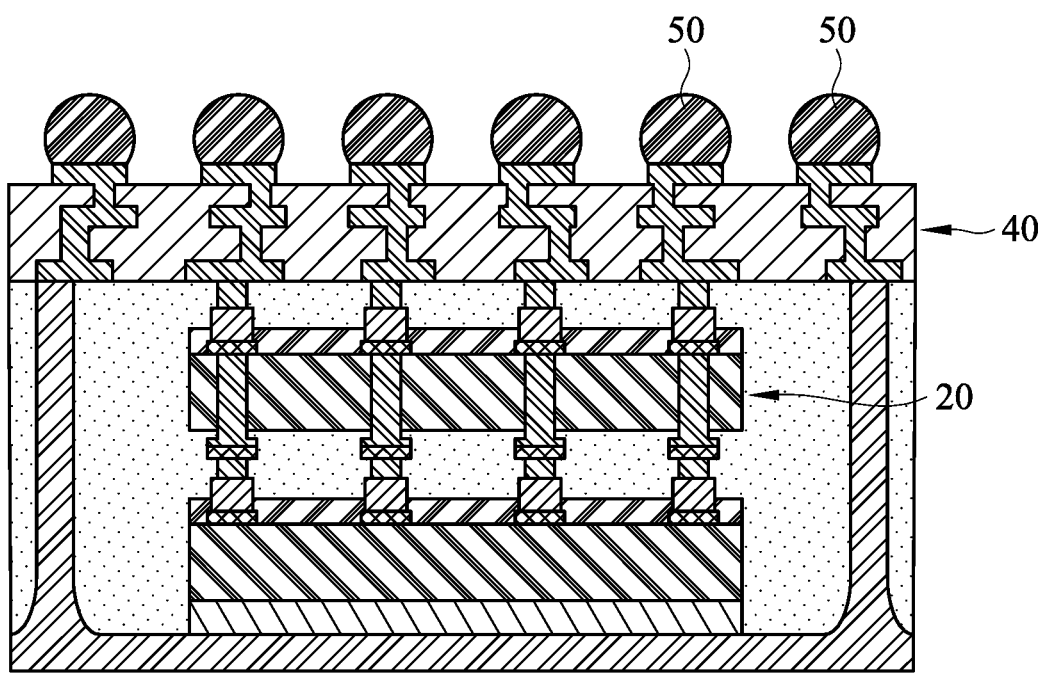

In FIG. 2F, the outer pads 50 are formed on the redistribution layer. In the embodiment, the outer pads may be solder balls or conductive bumps.

Figure 3A:
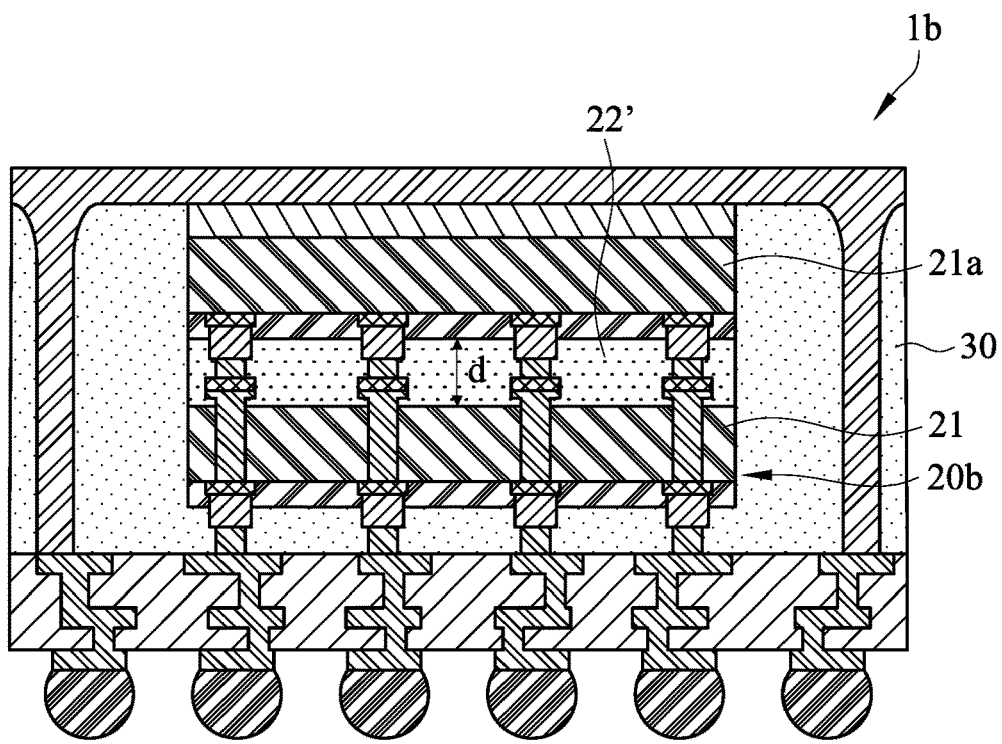
FIG. 3A illustrates a stacked package structure according to a third embodiment of the present invention.

FIG. 3A illustrates a stacked package structure 1b according to a third embodiment of the present invention. The stacked package structure 1b is similar to the stacked package structure 1 as shown in FIG. 1A, but a stacked chipset 20b further has at least one insulation layer 22' formed in the corresponding gap d. A material of the insulation layer 22' may differ from that of the encapsulation 30. The insulation layer 22' may be an anisotropic conductive film, an underfill material or the like.

Figure 3B:
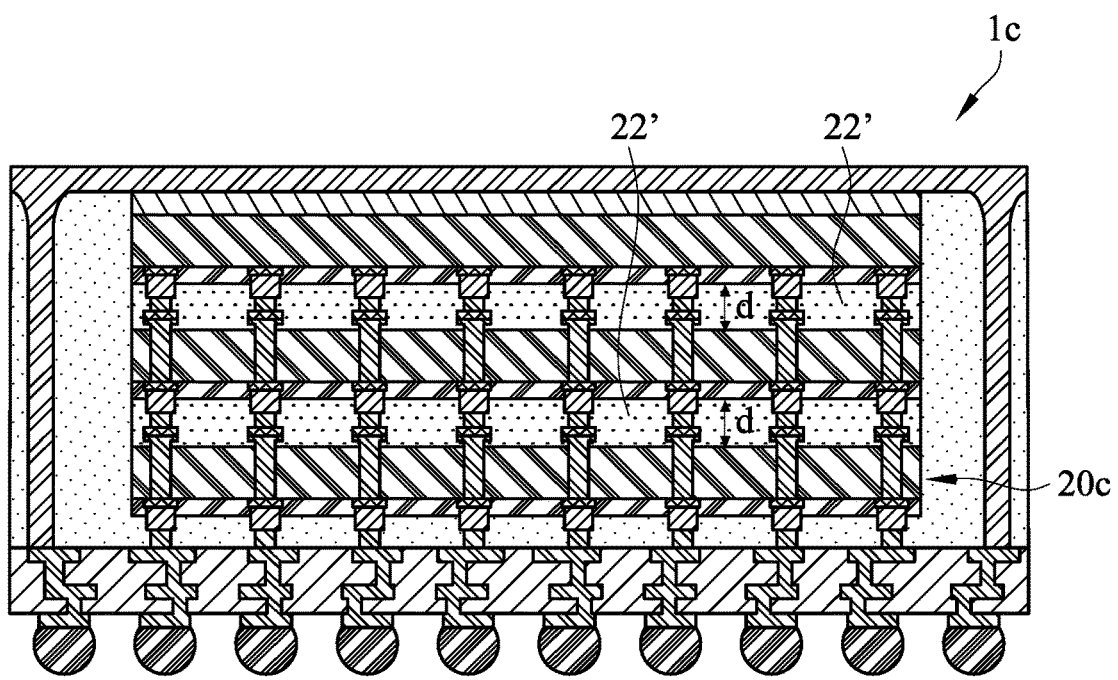
FIG. 3B illustrates a stacked package structure according to a fourth embodiment of the present invention.

FIG. 3B illustrates a stacked package structure 1c according to a fourth embodiment of the present invention. The stacked package structure 1c is similar to the stacked package structure 1a shown in FIG. 1B, but a stacked chipset 20c further has a plurality of insulation layers 22' correspondingly formed in the gaps d. A material of the insulation layer 22' may differ from that of the encapsulation 30. The insulation layer 22' may be an anisotropic conductive film, an underfill material or the like.

The fabricating method of the stacked package structure 1b shown in FIG. 3A is further described as follow.

Figure 4A:
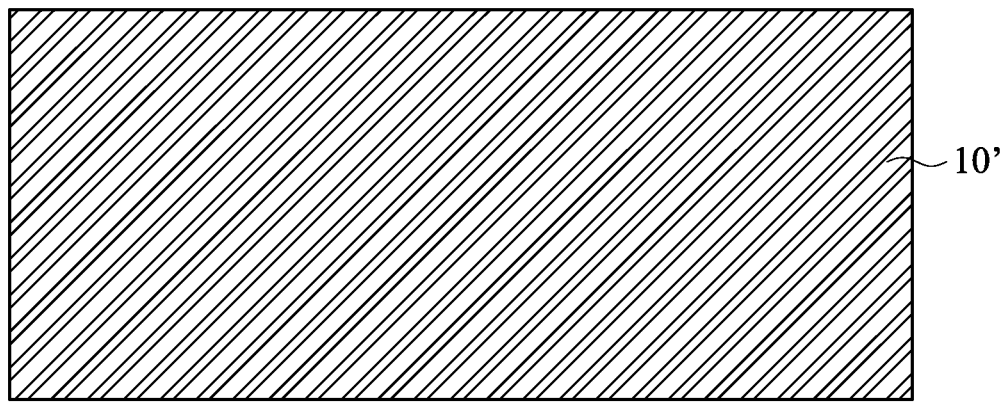
FIGS. 4A to 4F illustrate the stacked package structure of FIG. 3A in the process corresponding to steps of a fabricating method according to a second embodiment of the present invention.
Figure 4B:
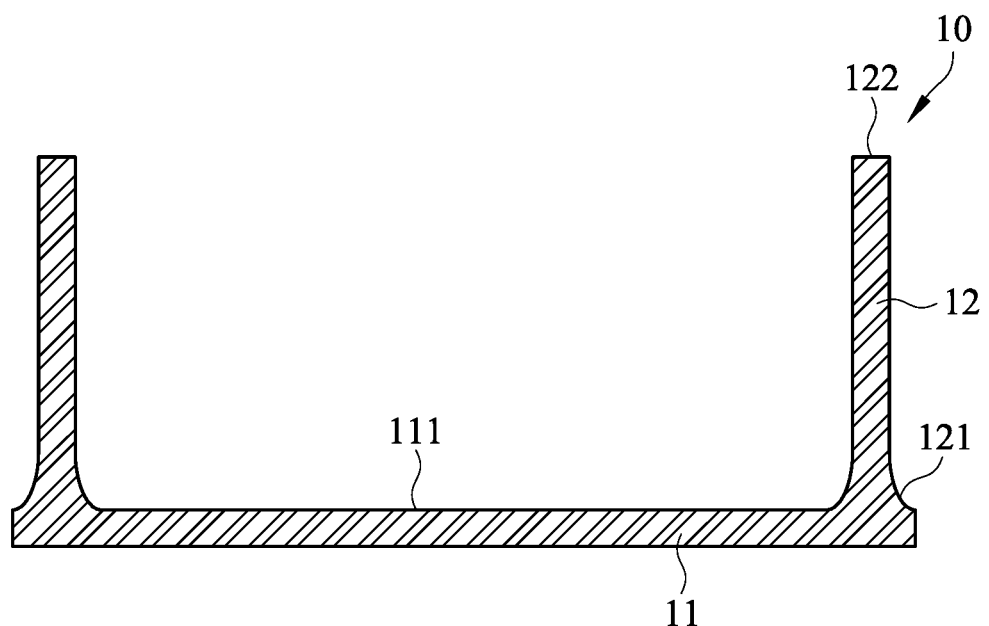

FIGS. 4A and 4B illustrate how to form the metal casing. The method may be similar to the method shown in FIGS. 2A and 2B.

Figure 4C:
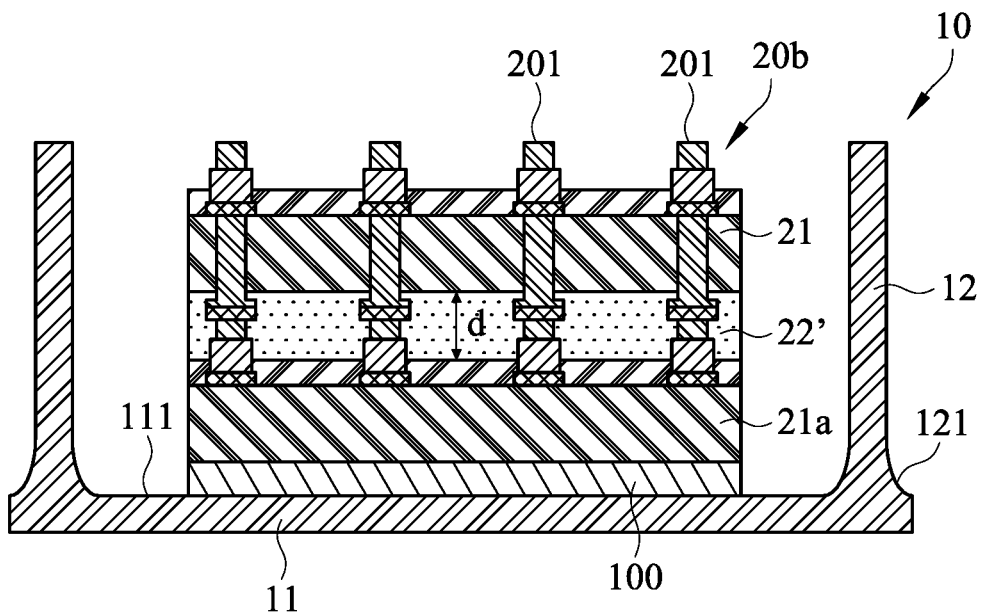

With reference to FIG. 4C, the adhesive layer 100 is formed on the inner surface 111 of the lateral portion 11 of the metal casing 10. The stacked chipset 20b is disposed on the adhesive layer 100 and adhered to the inner surface 111 of the lateral portion 11 through the adhesive layer 100. In the embodiment, the stacked chipset 20b further has an insulation layer 22' formed in the corresponding gap d.

Figure 4D:
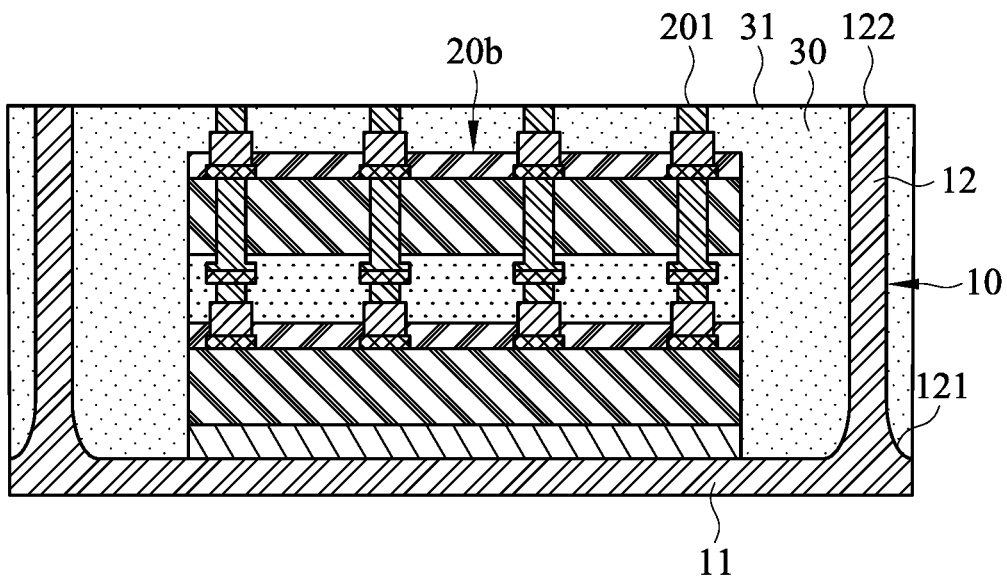

With reference to FIG. 4D, the metal casing 10 is filled with a molding compound to form the encapsulation 30 and encapsulate the stacked chipset 20. The surfaces of the metal pads 201 may be exposed through the encapsulation 30. In some embodiment, the surfaces of the metal pad 201 may be exposed by grinding excess of the encapsulation 30. In the embodiment, the encapsulation 30 further encapsulates the longitudinal portions 12 of the metal casing 10. The surfaces of the free ends 122 of the longitudinal portions 12 are exposed through the encapsulation 30. The outer surface 31 of the encapsulation 30, the surfaces of the metal pads 201 of the stacked chipset 20b and the surfaces of the free ends 122 are coplanar to each other.

Figure 4E:
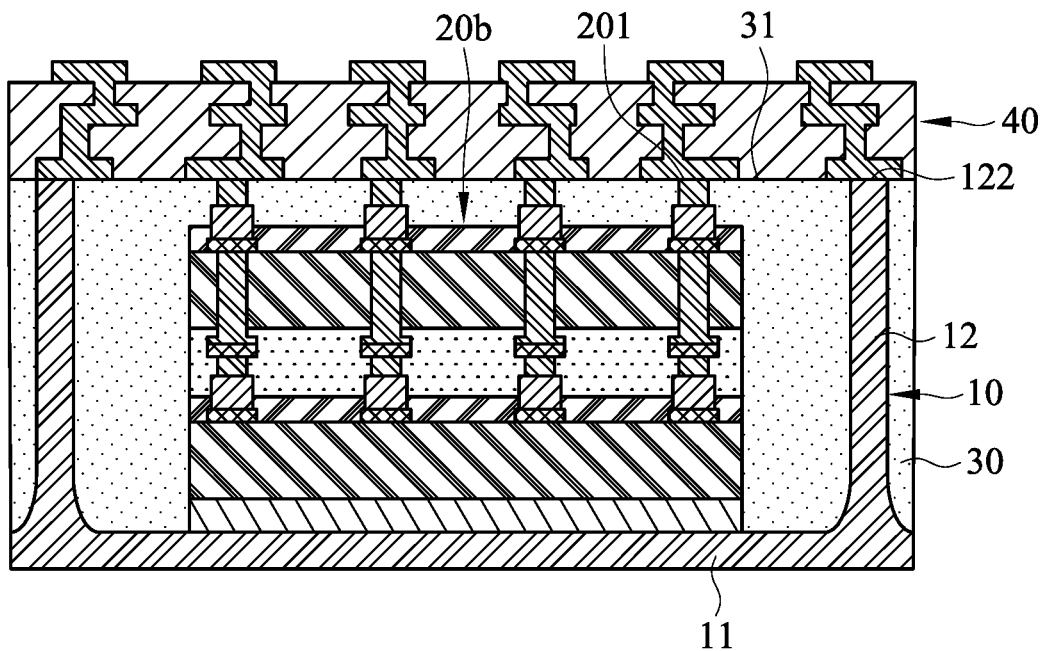

With reference to FIG. 4E, the redistribution layer 40 is formed on the outer surface 31 of the encapsulation 30, and electrically connects to the metal pads 20 of the stacked chipset 20b and the free ends 122 of the longitudinal portions 12.

Figure 4F:
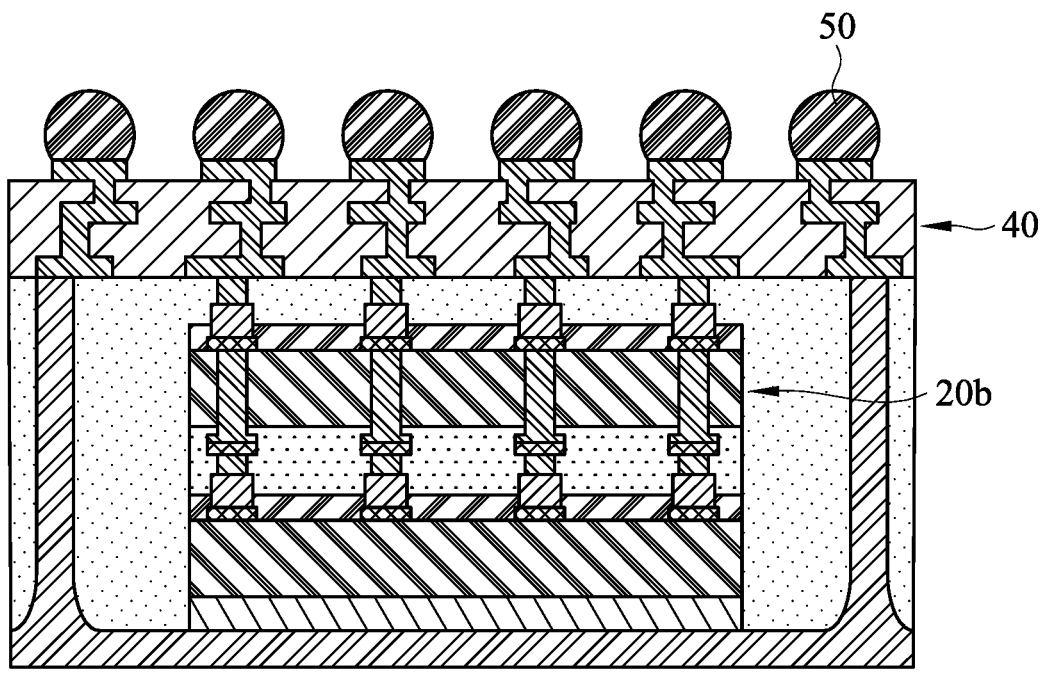
Figure 5:
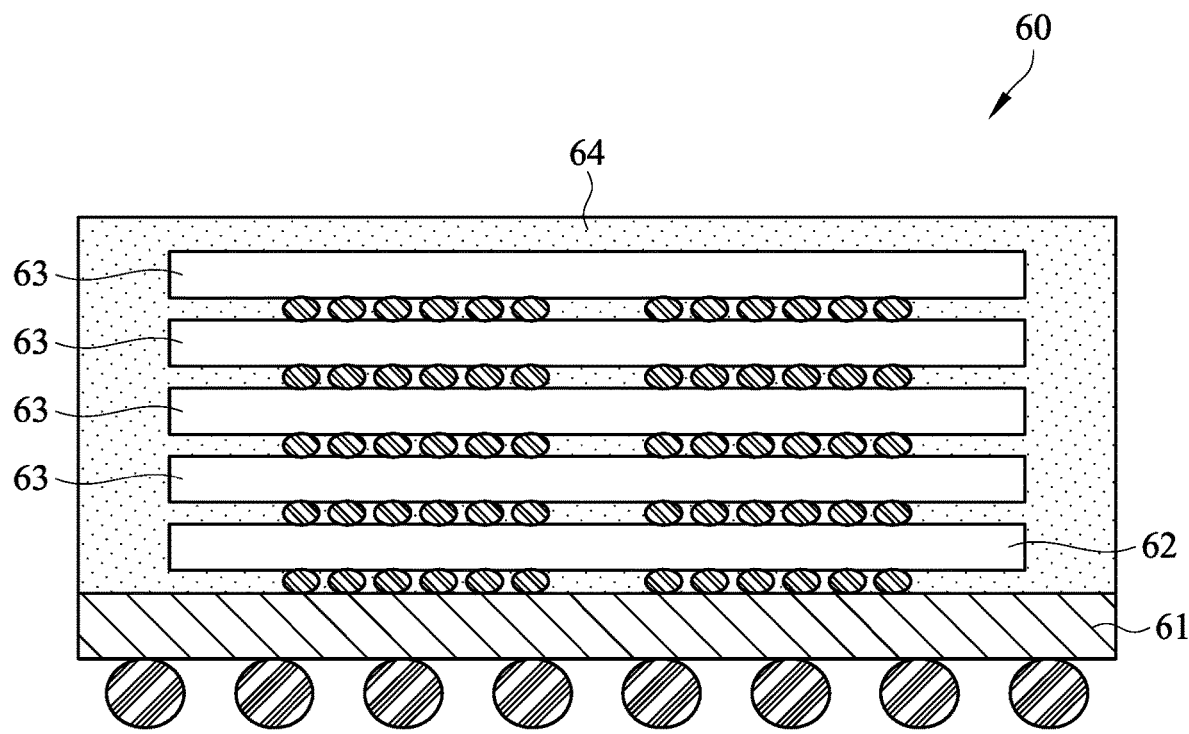
FIG. 5 is a cross-sectional view of a stacked package structure in accordance with the prior art.

With reference to FIG. 4F, the outer pads 50 are formed on the redistribution layer 40. In the embodiment, the outer pads 50 may be solder balls or conductive bumps.

Based on the foregoing description, in the fabricating method of the present invention, the metal casing and the stacked chipset are previously prepared. After the stacked chipset is adhered in the metal casing, the encapsulation may be easily formed in the metal casing to encapsulate the stacked chipset. The redistribution layer may be formed on the encapsulation and electrically connects to the metal pads of the stacked chipset. Therefore, the metal casing is easily packaged in the stacked package structure. The stacked package structure of the present invention includes the metal casing, so efficiency of heat dissipation and structural strength are increased. In addition, after the metal casing is electrically connected to the ground of the system power, the metal casing is used as the EMI shielding casing for the stacked package structure.

Even though numerous characteristics and advantages of the present invention have been set forth in the foregoing description, together with the details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A stacked package structure, comprising:
    a metal casing having a lateral portion and a plurality of longitudinal portions extending from an inner surface of the lateral portion;
    a stacked chipset having:
        an active surface having a plurality of metal pads; and
        a rear surface opposite to the active surface and adhered to the inner surface of the lateral portion of the metal casing;
    an encapsulation encapsulating the stacked chipset and all outsides of the longitudinal portions of the metal casing, wherein a plurality of surfaces of the plurality of metal pads, each surface of a plurality free ends of the longitudinal portions and an outer surface of the encapsulation are coplanar to constitute a coplanar surface; and
    a redistribution layer directly formed on the coplanar surface constituted by the surfaces of the plurality of metal pads, each surface of the free ends of the longitudinal portions and the outer surface of the encapsulation, wherein the redistribution layer electrically connecting to the plurality of metal pads of the stacked chipset.

2. The stacked package structure as claimed in claim 1, wherein a width of one end of each longitudinal portion close to the inner surface of the lateral portion is larger than a width of the free end of each longitudinal portion far away from the inner surface of the lateral portion.

3. The stacked package structure as claimed in claim 1, wherein the stacked chipset comprises a plurality of chips stacked on top of each other and at least one gap defined between adjacent chips, wherein
    one of the chips is adhered to the inner surface of the lateral portion without a plurality of through silicon vias; and
    each of the at least one chip stacked on the chip adhered to the inner surface has a plurality of through silicon vias.

4. The stacked package structure as claimed in claim 3, wherein the stacked chipset further comprises at least one insulation layer formed in the corresponding gap.

5. The stacked package structure as claimed in claim 4, wherein the insulation layer is an anisotropic conductive film, an underfill material or a molding compound.

6. The stacked package structure as claimed in claim 4, wherein one of the chips far away from the chip adhered to the inner surface is a control chip and others of chips are memory chips.

7. The stacked package structure as claimed in claim 1, wherein the redistribution layer further electrically connects to the free ends of the longitudinal portions of the metal casing.

8. The stacked package structure as claimed in claim 1, further comprising an adhesive layer between the rear surface of the stacked chipset and the inner surface of the lateral portion.

* * * * *